US011170837B1

(12) United States Patent
Miller et al.

(10) Patent No.: US 11,170,837 B1
(45) Date of Patent: Nov. 9, 2021

(54) IDENTIFYING HIGH IMPEDANCE FAULTS IN A MEMORY DEVICE

(71) Applicant: Micron Technology, Inc., Boise, ID (US)

(72) Inventors: Daniel S. Miller, Boise, ID (US); Yoshinori Fujiwara, Boise, ID (US)

(73) Assignee: Micron Technology, Boise, ID (US)

( * ) Notice: Subject to any disclaimer, the term of this patent is extended or adjusted under 35 U.S.C. 154(b) by 0 days.

(21) Appl. No.: 16/860,498

(22) Filed: Apr. 28, 2020

(51) Int. Cl.
*G11C 11/22* (2006.01)
*G11C 11/4096* (2006.01)
*G11C 29/04* (2006.01)
*G11C 11/4094* (2006.01)

(52) U.S. Cl.
CPC ........ *G11C 11/2275* (2013.01); *G11C 11/221* (2013.01); *G11C 11/2255* (2013.01); *G11C 11/2273* (2013.01); *G11C 11/4094* (2013.01); *G11C 11/4096* (2013.01); *G11C 29/04* (2013.01)

(58) Field of Classification Search
CPC .................................................. G11C 11/2275
USPC ......................................................... 365/145
See application file for complete search history.

(56) References Cited

U.S. PATENT DOCUMENTS

| 5,592,419 | A | * | 1/1997 | Akaogi | G05F 3/205 365/185.18 |
|---|---|---|---|---|---|
| 6,011,713 | A | * | 1/2000 | Yamane | G11C 11/419 365/154 |
| 2011/0149668 | A1 | * | 6/2011 | Kumar | G11C 11/412 365/203 |
| 2016/0027504 | A1 | * | 1/2016 | Lee | G11C 16/3459 365/185.03 |
| 2016/0049192 | A1 | * | 2/2016 | Lee | G11C 11/5642 365/185.03 |

* cited by examiner

*Primary Examiner* — Muna A Techane
(74) *Attorney, Agent, or Firm* — Holland & Hart LLP

(57) ABSTRACT

Methods, systems, and devices related to identifying high impedance faults in a memory device are described. A memory device may perform a first write operation to write a first logic state to a memory cell. During the first write operation, the memory device may establish a connection between a supply line and a control line associated with applying an output of a driver of a digit line coupled to the memory cell. After performing the first operation, the memory device may configure the supply line in a floating state. After the supply line is floated, the memory device may perform a second write operation to write a second logic state to the memory cell. The memory device may perform a third operation for reading the memory cell. The memory device may determine the condition of the supply line or control based on the result of the read operation.

20 Claims, 8 Drawing Sheets

500

IDENTIFYING HIGH IMPEDANCE FAULTS IN A MEMORY DEVICE

BACKGROUND

The following relates generally to one or more memory systems and more specifically to identifying high impedance faults in a memory device.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Improving memory devices may include increasing memory cell density, increasing read/write speeds, increasing reliability, increasing data retention, reducing power consumption, or reducing manufacturing costs, among other metrics.

DETAILED DESCRIPTION

Figure 1:
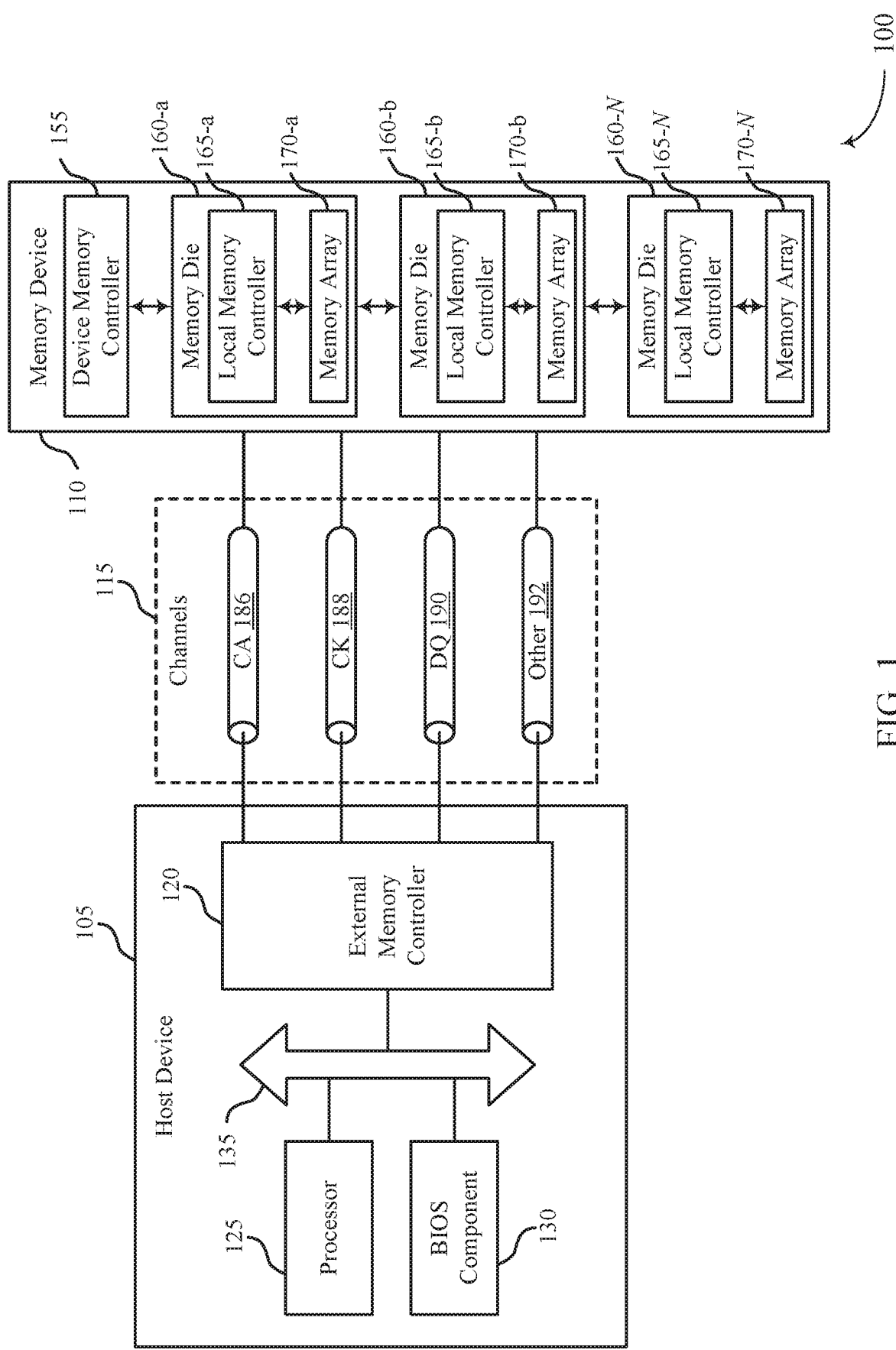
FIG. 1 illustrates an example of a system that supports identifying high impedance faults in a memory device in accordance with examples as disclosed herein.

A memory device may include a memory array of cells and multiple sense components to read data from or write data to the memory cells. The memory device may also perform a column decoding operation when performing a write operation to select the memory cell. The memory device may generate specific activation signals for each column or group of columns to select the decoded columns. The memory device may implement a circuit to select the decoded columns. For example, the memory device may implement a circuit (e.g., a column select circuit) to activate a driver (e.g., which may be in a sense component) of a digit line to select a memory cell. In some examples, the circuit may decode a memory address received to generate an activation signal to activate a pass transistor located between the sense amplifier and the digit line to select the digit line coupled with the memory cell. In some examples, the pass transistor may be located within the sense amplifier. The circuit may include a supply line to supply a voltage to multiple control lines. The control lines may be adjacent to each other and may send the activation signals for the data pass transistors to the drivers. In some cases, the control lines or supply line may include faults or defects that may cause errors in activating the driver, and the faults may be associated with unnecessary power consumption, further access operation errors, or other disadvantages. The memory device may have faults or defects between the supply line and control lines, such as the lines being shorted together (e.g., the supply line and control line may be shorted together, or multiple control lines may be shorted together), manufacturing defects (e.g., insufficient tolerances), or there may be tiny traces of metal between the lines that may cause resistive shorts. In some cases, a memory device may perform a test of the circuit to determine if a fault or defect exists in the control or supply line.

Enhanced fault detection for a memory device may be achieved by performing testing schemes for detecting errors in the circuit as disclosed herein. For example, the memory device may float the supply line and keep the control line activated in a test operation where multiple write operations occur. In some examples, the memory device may initiate the test mode and perform a first write operation to write a first set of data to a memory cell. The memory device may also establish a connection between the supply line and control line during the first write operation. After the first write operation, but while the connection between the supply line and control is still active, the memory device may float the supply line. The memory device may then attempt a second write operation after a predetermined period to write a second set of data to the memory cell. After the second write operation, the memory device may deactivate the test mode and the control line may be deactivated. The memory device may also perform a read operation after the second write operation (e.g., reactivating the control line in some cases), where the existence of the fault in the control line or supply line is determined based on whether the first data or second data is read from the memory cell. Thus, the existence of a fault or detect may be detected based on whether the memory cell is successfully written during the second write operation.

Features of the disclosure are initially described in the context of memory systems and dies as described with reference to FIGS. 1 and 2. Features of the disclosure are described in the context of circuit diagrams, column enable latches, and timing diagrams as described with reference to FIGS. 3-6. These and other features of the disclosure are further illustrated by and described with reference to an apparatus diagram and flowcharts that relate to identifying high impedance faults in a memory device as described with reference to FIGS. 7-8.

FIG. 1 illustrates an example of a system 100 that supports identifying high impedance faults in a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory, controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

In some cases, the memory device 110 may include faults or defects within the memory die 160. For example, memory die 160 may include multiple control lines (e.g., column select lines) that run adjacent to each other. The control lines may send signals to activate a driver within the memory die 160 to perform an access operation (e.g., a read operation, a write operation, a refresh operation) on a memory cell in the memory array 170. The control lines may also at times be coupled with a supply line that generates the voltage for the control lines. The memory device 110 may have faults between the control lines or supply line that may cause errors in activating the driver and performing access operations. For example, the lines may be shorted together (e.g., the supply line and control line may be shorted together, multiple control lines may be shorted together). The memory device 110 may perform a test to detect the existence of the fault or defect. In some cases, the memory device 110 may test the control and supply line by initiating a test mode and sending an activation signal to the control line and determine whether a fault or defect exist. The memory device may determine the existence of a hard fault (e.g., low impedance short) by sending the activation signal but having the control line stay deactivated, which may be detected because an access operation may fail. In other cases, the control line and supply line may have traces of metal or other material between them causing a soft fault (e.g. a high impedance short). The memory device 110 may fail to detect a soft fault by sending the active activation signal to the control line as the control line may activate despite the high impedance fault.

According to various aspects, the memory device 110 may perform a test operation for determining whether a high impedance short or other defect exists that includes floating the supply line in between two write operations. For example, the memory device 110 may perform a first write operation, to write a first set of data to the memory, cell, then float the supply line, and subsequently attempt a second write operation to write a second set of data to the memory cell. The memory device 110 may then perform a read operation and detect the existence of a defect based on the set of data read from the memory cell. For example, if the memory device 110 reads the first set of data from the memory cell then a defect may exist. In contrast, if the memory device 110 reads the second set of data from the memory cell an absence of a defect associated with the control line or supply line may be detected.

Figure 2:
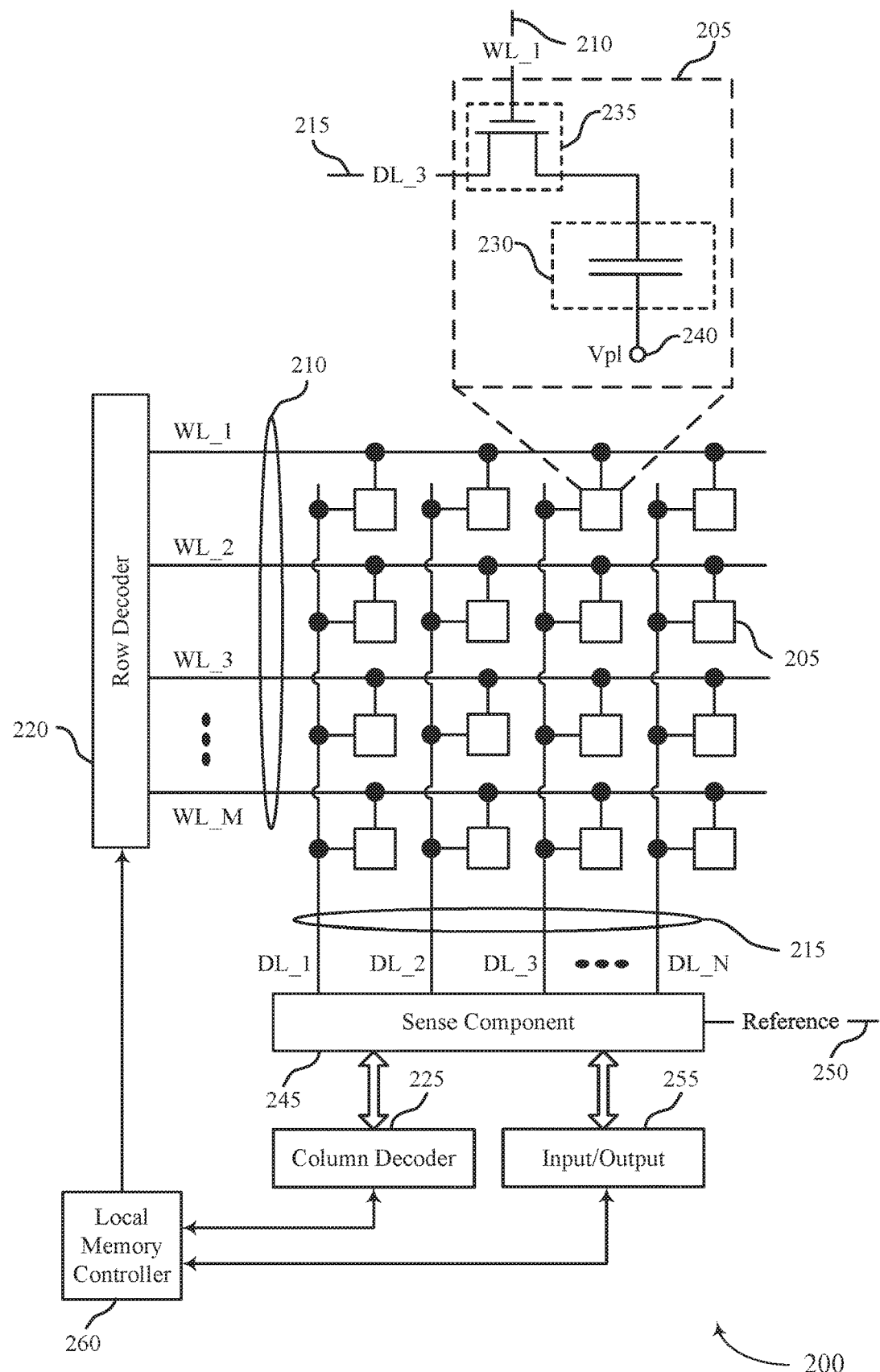
FIG. 2 illustrates an example of a memory die that supports identifying high impedance faults in a memory device in accordance with examples as disclosed herein.

FIG. 2 illustrates an example of a memory die 200 that supports identifying high impedance faults in a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. In some examples, a column decoder 225 may receive a column address from the local memory controller 260 and may activate a digit line 215 based on the received column address. Additionally or alternatively, the column decoder 225 may activate the path between an input/output component 255 and the sense component 245.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage), The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations relate to the operating of the memory die 200 that are not directly related to accessing the memory cells 205.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

Memory die 200 may include a column select circuit (not shown). The column select circuit may be coupled with the sense component 245 and include multiple control lines (e.g., column select lines). The column select circuit may be configured to decode a received memory address and generate an activation signal on the control line to activate the sense component 245. For example, the column select circuit may receive a command to activate a certain column (or set of columns) within memory die 200. The column select circuit may decode the address and transmit a signal on the control line to activate the sense component 245 to drive a signal on a given digit line 215 that is associated with the memory address. The memory die 200 may then activate a memory cell 205 based on a signal being driven to the digit line 215. In some examples, a memory device (e.g., as described with reference to FIG. 2) may include 128 control lines that each activate 8 digit line sense components (e.g., 1024 total digit line sense components) of sense component 245. In other examples, the memory device may include more or less than 128 control lines and 1024 digit line sense components. Thus, the memory device may implement a column select circuit to activate a given column or set of columns based on an associated received memory command. When a memory die 200 is manufactured, the column select circuit may include a defect. The memory device may perform a test operation to determine whether a defect exists. For example, the memory device may float a supply line within the column select circuit in between two write operations. The memory device may write a first set of data during the first write operation and a second set of data during the second write operation. The memory device may then perform a read operation following the two write operations. The existence of the defect may be determined based on the state read from the memory cell 205 during the read operation.

Figure 3:
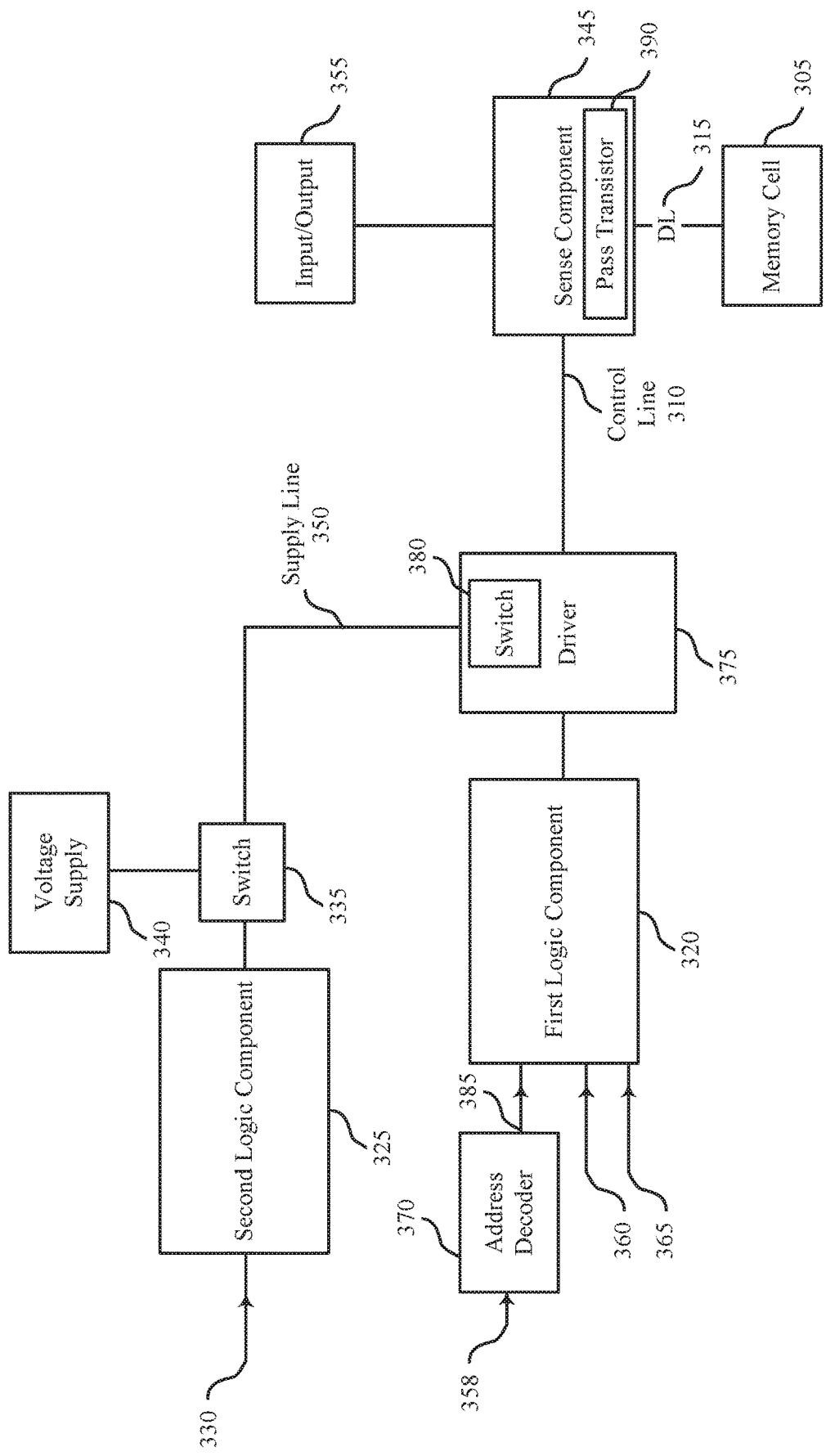
FIG. 3 illustrates an example of a circuit diagram that supports identifying high impedance faults in a memory device in accordance with examples as disclosed herein.

FIG. 3, illustrates a circuit diagram 300 that supports identifying high impedance faults in a memory device in accordance with examples as disclosed here in. The circuit diagram 300 may illustrate aspects of a memory device employing the column select circuit as described with reference to FIG. 2. Circuit diagram 300 may include aspects of memory arrays as described with reference to FIG. 2. For example, memory cell 305 may be an example of memory cell 205 as described with reference to FIG. 1; digit line 315 may be an example of digit line 215 as described with reference to FIG. 2; sense component 345 may be an example of sense component 245 as described with reference to FIG. 2; and input/output component 355 may be an example of input/output component 255 as described with reference to FIG. 2. Circuit diagram 300 may further include a first logic component 320, a second logic component 325, a switch 335, a voltage supply 340, a supply line 350, an address decoder 370, a driver 375 including a switch 380, and a control line 310. For the sake of clarity, a single supply line 350, switch 335, first logic component 320, second logic component 325, address decoder 370, driver 375, switch 380, and control line 310 is shown, although a memory device may have multiple instances of such components. The first logic component 320 may receive a column address signal 358, a column enable signal 360, and a test mode signal 365. The second logic component 325 may also receive a float signal 330. Additionally, circuit diagram 300 may include a pass transistor 390. In this example, the pass transistor may be in the sense component 345. In other examples; the pass transistor 390 may be located between the sense component 345 and the digit line 315.

During a write operation, a memory device (e.g., a memory device as described with reference to FIG. 1) may select a memory cell 305 during a write operation. The memory device may send data from the input/output 355 to a driver in the sense component 345 during the write operation. The circuit diagram 300 may be configured to activate the pass transistor 390 and allow the driver of the sense component to drive the data to the digit line 315 onto the memory cell 305. That is, pass transistor 390 may allow data to pass from the input/output component 355 to the memory cell 305. For example, the column select circuit 300 may receive a column address signal 358 associated with memory cell 305 at the address decoder 370. The column address signal 358 may represent several bits of information associated with the address of memory cell 305. For example, the column address signal 358 may include multiple different signals that may represent bits of the column address. The address decoder 370 may decode the column address signal 358. For example, the address decoder 370 may be implemented with a data bus and decode the column address signal 358 by implementing a bus decoding scheme. The address decoder 370; after decoding the column address signal 358, may generate a column activation signal 385. The column activation signal 385 may be associated with sense component 345, the pass transistor 390, and a driver of the digit line 315 for the memory cell 305. That is, the address decoder 370 may decode the column address signal 358 and send a signal that will activate the sense component 345 (or the pass transistor 390) that is associated with the column address 355. In this example, the driver of the digit line 315 may be included within the sense component 345 for reading operations. In other examples, the driver of the digit line 315 may be separate from the sense component 345 (e.g., between the sense component 345 and the memory cell 305).

The circuit diagram 300 may also receive a column enable signal 360 to the first logic component 320 while receiving the column address signal 358. The first logic component 320 may be configured to generate an enabling signal based on receiving the column enable signal 360 and the column activation signal 385. The first logic component 320 may send the generated enabling signal to driver 375 and the switch 380. The driver 375 may include a switch 380 that is activated based on the driver 375 receiving the enabling signal from the first logic component 320. The switch 380 may establish a connection between the supply line 350 and the control line 310 when activated, enabling the control line 310 to be driven to the voltage supply 340 (e.g., VDD).

While the first logic component 320 is generating the enabling signal for the driver 375, the second logic component 325 may be configured to generate and send an activation or deactivation signal to switch 335 based on the float signal 330. That is, the activation signal may turn the switch on, and the deactivation signal may turn the switch 335 off. In this case, the second logic component may activate the switch 335 based on receiving a disabled float signal 330. When the switch 335 is active, the voltage supply 340 may charge the supply line 350 to a first voltage (e.g., VDD). The circuit diagram 300 may apply the first voltage to the control line 310 when the switch 380 is activated based on the driver 375 being activated. Control line 310 may also be coupled with the sense component 345. When the control line 310 is supplied with the voltage from supply line 350, the control line 310 may activate the driver of digit line 315 (e.g., the sense component). For example, the control line 310 may activate the pass transistor 390 in sense component 345. The pass transistor 390 being activated may activate the driver of the digit line 315. The pass transistor 390, when activated, may allow data to pass from the sense component to the digit line 315 and onto the memory cell 305 (e.g., when the word line for the memory cell 305 is activated) from the input/output component 355. In other examples, the pass transistor 390 may be between the sense component 345 and the digit line 345. Additionally or alternatively, the sense component 345 may be activated in a different manner to drive the digit line 315.

In some examples, circuit diagram 300 may include a fault. Supply line 350, control line 310, or both may have defects, such as shorts (e.g., supply line 350 may be shorted with control line 310, or multiple control lines 310 may be shorted together), or there may be metal traces between the control line 310 and the supply line 350, or other manufacturing defects may be present. In some examples, supply line 350, control line 310, or both may have a hard fault (e.g., a low impedance short) or a soft fault (e.g., a high impedance short). In some cases, the memory device may perform a test operation to determine the existence of a fault in accordance with the examples as disclosed herein. When performing the test operation, the column address may be configured such that any activated supply line 350 or control line 310 has adjacent supply lines 350 or control lines 310 in a deactivated state.

When the memory device performs a test operation for high impedance faults according to various aspects discussed herein, the memory device may perform two write operations to determine the existence of a fault. The circuit diagram 300, during the test operation, may receive a test mode signal 365 to configure the circuit diagram 300 in a test mode. The circuit diagram 300 may then receive a column address signal 358 for the first write operation. The address decoder 370 may decode the column address signal 358 and generate a column activation signal 385. The circuit diagram 300, while receiving the column address signal 358, may also receive a column enable signal 360. The first logic component 320 may be configured to combine the test mode signal 365, the column address signal 358, and the column enable signal 360 and generate an activation signal and send the activation signal to the driver 375. The driver 375 may be activated based in part on receiving the activation signal. The switch 380 may be activated and couple the control line 310 and supply line 350 based on the driver 375 being activated. The first logic component 320 may also be configured to latch the control line 310 to stay activated until a second column enable signal 360 is received based in part on receiving the test mode signal 365, the column enable signal 360, and generating the activation signal for driver 375.

The circuit diagram 300 may receive a float signal 330 at the second logic component 325 after the memory device performs the first write operation but before the memory device performs the second write operation. The second logic component 325 may generate a deactivation signal based on receiving the float signal 330 and subsequently deactivate the switch 335 based on generating the deactivation signal. When switch 335 is deactivated, the supply line 350 may be isolated from the voltage supply 340, Circuit diagram 300 may float the supply line 350 during the period between the first and second write operations while the switch 335 is deactivated.

The memory device, while in the test mode, may write a first set of data during the first write operation and a second set of data during the second write operation. The memory device may then deactivate the test mode by disabling the test mode signal 365. After the second write operation, the first logic component 320 may be configured to generate a deactivation signal and deactivate the driver 375. The circuit diagram 300 may also activate switch 335 after the second write operation based on the float signal 330 being disabled. The voltage supply 340 may be coupled with the supply line 350 when the switch 335 is activated. The memory device may also perform a read operation after the second write operation of the test operation is performed to determine whether a fault exists in the control line 310, the supply line 350, or both (e.g., based on whether the first data or second data is read).

Figure 4:
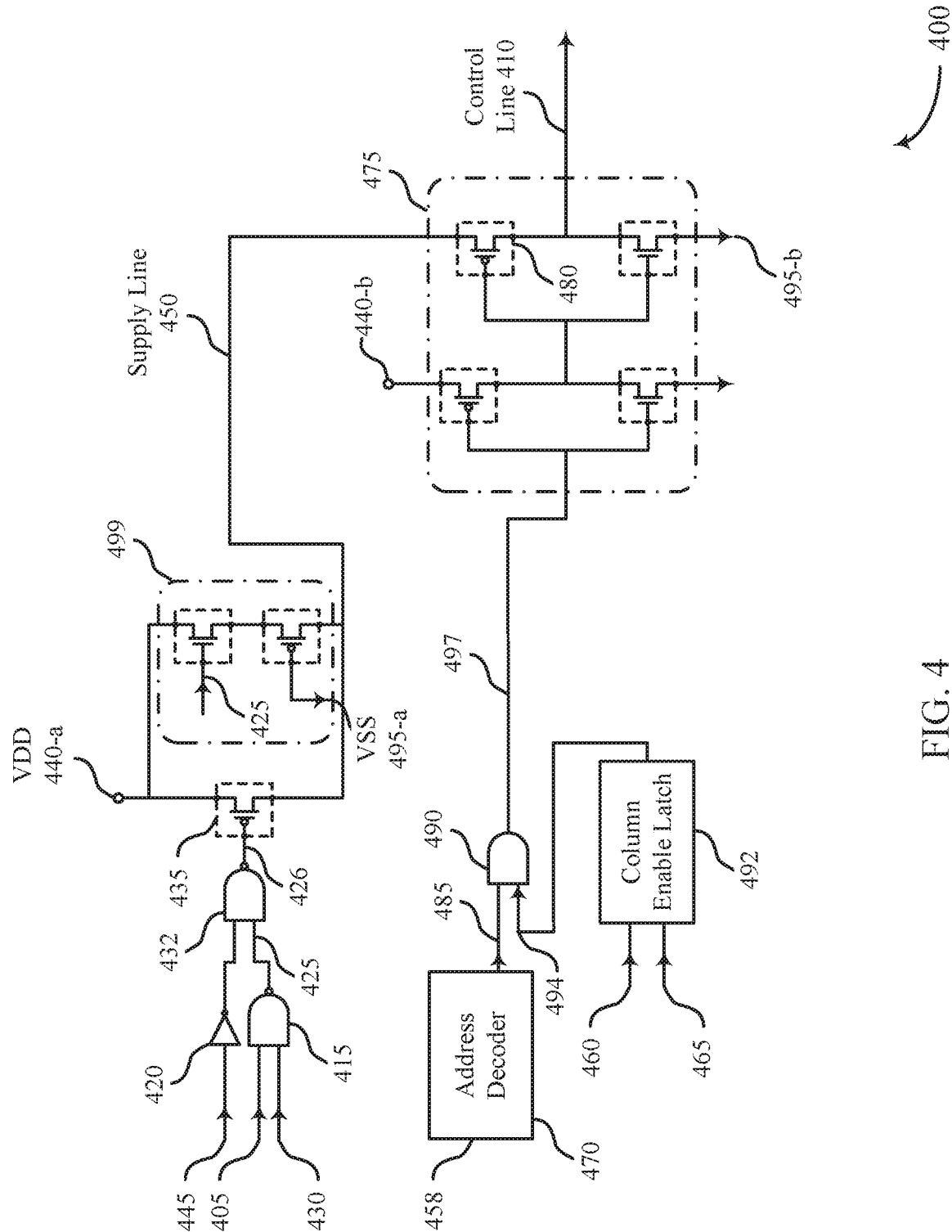
FIG. 4 illustrates an example of a circuit diagram that supports identifying high impedance faults in a memory device in accordance with examples as disclosed herein.

FIG. 4 illustrates a circuit diagram 400 that supports identifying high impedance faults in a memory device in accordance with examples as disclosed herein. The circuit diagram 400 may include aspects or be an example of the circuit diagram 300 as described with reference to FIG. 3. For example; control line 410 may be an example of control line 310 as described with reference with to FIG. 3; switch 435 may be an example of switch 335 as described with reference to FIG. 3; VDD 440-*a* may be an example of the voltage supply 340 as described with reference to FIG. 3; supply line 450 may be an example of supply line 350 as described with reference to FIG. 3; column address signal 458, column enable signal 460, and test mode signal 465 may be examples of column address signal 358, column enable signal 360, and test mode signal 365 as described with reference to FIG. 3; driver 475 may be an example of driver 375 as described with reference to FIG. 3; switch 480 may be an example of switch 380 as described with reference to FIG. 3; column activation signal 485 may be an example of column activation signal 385 as described with reference to FIG. 3; and address decoder 470 may be an example of address decoder 370 as described with reference to FIG. 3.

The circuit diagram 400 may also further include an inverter 420, a NAND gate 415, a NAND gate 432 (which collectively may be an example of a second logic component 325 as described with reference to FIG. 3), an AND gate 490 and column enable latch 492 (which collectively may be an example of the first logic component 320 as described with reference to FIG. 3), test signal 405, float signal 425, switch control signal 426, control signal 430, input signal 445, driver signal 497, latch signal 494, a clamp 499, and a VSS voltage supply 495.

As described with reference to FIGS. 2 and 3, when the memory device performs a write operation, the circuit diagram 400 may receive a column address signal 458, decode the column address signal 458 at the address decoder 470, activate a driver 475 to select a control line 410 associated with a sense component based on the column address signal 458, and activate the sense component (or pass transistor) to drive an output onto a digit line to select a memory cell. In some cases, the memory device may perform a test operation to detect a fault in the control line 410 and the supply line 450 by floating the supply line 450. The memory device, during the testing operation, may issue a first write command and a second write command. Additionally, the circuit diagram 400 may be configured in a variety of ways to float the supply line 450 and the example disclosed herein is not limiting.

The memory device may initiate a test operation by sending a test mode signal 465 to the column enable latch 492. The memory device may also send an additional test signal 405 to NAND gate 415. The memory device may then generate a column address signal 458 that is decoded at the address decoder 470 (e.g., as described with reference address decoder 370 of FIG. 3) The address decoder 470 may then generate a column activation signal 485. The memory device may also send a first column enable signal 460 to the column enable latch 492. The first column enable signal 460 may stay activated for a clock cycle of the memory device before becoming deactivated. The column enable latch 492 may combine the test mode signal 465 and the first column enable signal 460 (e.g., a ColEnIn signal) to generate an active latch signal 494 (e.g., a ColEn signal). The column enable latch 492 may cause latch signal 494 to stay activated until a second activation of the column enable signal 460 is received at the column enable latch 492. The column enable latch 492 may output latch signal 494 to an AND gate 490. The AND gate 490 may then combine the column activation signal 485 and the latch signal 494 and generate an activated driver signal 497. That is, the AND gate 490 may generate an activated driver signal 497 based on receiving an activated column activation signal 485 and activated latch signal 494. The AND gate may generate a deactivated driver signal 497 if either the latch signal 494 or column activation signal 485 are deactivated. The activated driver signal 497 may subsequently activate the driver 475 based on the activated column activation signal 485 and activated latch signal 494. The activated driver signal 497 may also activate switch 480 and establish a connection between the supply line 450 and the control line 410 during the test operation.

The memory device may also deactivate the input signal 445 sent to the inverter 420. The input signal 445 may indicate a reception of an ACT command issued by the memory device to activate a section of the memory device that comprises the memory cell associated with the column address signal 458 when the device is not in a test mode operation. That is, when a word line (e.g., a word line 210 as described with reference to FIG. 2) is active, the memory device also activates a column decoder (e.g., a column decoder 225 as described with reference to FIG. 2) to select memory cells associated with the column address signal 458. In contrast, the input signal 445 may be deactivated during the test mode operation as a step to float the supply line 450. The inverter 420 may generate an enabling signal and output the signal to the NAND gate 432. While the test signal 405 is active, the NAND gate 415 may generate an active float signal 425. In this example, when the test signal 405 and float signal 425 are active, they may have a logic value 1 and be in a high state. Accordingly, when the float signal 425 is deactivated, it may have logic value 0 and be in a low state. When the NAND gate 432 combines the high float signal 425 with the enabling signal generated by the inverter 420, it may generate an active control switch signal 426 at the input of switch 435. Switch 435 may be a PCH transistor and is activated when the voltage at the gate is below a threshold value for switch 435. In this case, the NAND gate 432 may generate the active control switch signal 426 at a voltage that is below the threshold value for switch 435. In other examples, the NAND gate 432 may generate a deactivated control switch signal 426 and the voltage of the deactivation signal may be higher than the threshold voltage of switch 435. Switch 435 may couple the voltage VDD 440-a to the supply line 450. Additionally, clamp 499 may receive the float signal 425. Clamp 499 may include two transistors that are both active (e.g., on) when the float signal 425 is high. That is, when the float signal 425 is active and has a high logic value, the NCH transistor may be active which enables the clamp 499 (e.g., the clamp is active when the float signal 425 is high).

After sending the first column enable signal 460 and performing the first write operation, the memory device may send a control signal 430 (e.g., an ASYNC signal) to the NAND gate 415. The control signal 430 may be received from a pin external to the circuit diagram 400. The control signal 430 may be a more precise way to control floating of the supply line 450 than the test signal 405 or test mode signal 465, which may come from registers or other sources that are static during access operations in test mode. Alternatively, the control signal 430 may be generated internally based on one or more of the test signals being active (e.g., test signal 405 or test mode signal 465), and command signals for an access operation. The NAND gate 415 may generate a deactivated float signal 425 based on the test signal 405 and the control signal 430 both being active. That is, in this example when the test signal 405 and control signal 430 are active, they may have a logic value 1 (e.g., high) and when float signal 425 is deactivated, it may have a logic value 0 (e.g., low). When float signal 425 is low, the NAND gate 432 may generate a deactivated control switch signal 426 and deactivate (e.g., turn off) the switch 435 based on the float signal 425 and input signal 445 being deactivated (e.g., low), Additionally, the low float signal 425 may also deactivate (e.g., turn off) the upper NCH transistor in the clamp 499. The combination of the switch 435 being deactivated and the float signal 425 being low may isolate the VDD 440-a from the supply line 450. That is, the clamp 499 may also be configured to be disabled when the float signal 425 is low allowing the supply line 450 to be maintained in a floating state. Thus, when the supply line 450 is floated, it may not drop from a predetermined level (e.g., VDD) after the switch 435 is deactivated based on the float signal 425 being low.

After the memory device has established a connection between the supply line 450 and the control line 410 and configured the supply line 450 in a floating state, the memory device may issue a second column enable signal 460 and perform a second write operation. The second column enable signal 460 may keep the signal 494 high and enable the memory device to perform the second write operation. After the column enable signal 460 is deactivated, the column enable latch 492 may be configured to deactivated latch signal 494. When the latch signal 494 is deactivated, the AND gate 490 may be configured to deactivate driver signal 497, thus deactivating the driver 475, disabling the control line 410, and deactivating the switch 480. Deactivating the switch 480 may disconnect the control line 410 from the supply line 450. Additionally, the memory device may deactivate control signal 430, which may enable NAND gate 415 to generate an active (e.g., high) float signal 425. Further, when float signal 425 is high, the NAND gate 432 may be configured to generate an activate control switch signal 426 for the switch 435. When the switch 435 is reactivated, it may couple the VDD 440-a back to the supply line 450. The clamp 499 may be activated based on the float signal 425 being high. The memory device may then disable the test mode and deactivate test signal 405 and test mode signal 465.

As described with reference to FIGS. 2 and 3, the memory device may write a first set of data to the memory cell during the first write operation while the connection between the control line 410 and the supply line 450 is established. Additionally, the memory device may write a second set of data to the same memory cell during the second write operation while the second column enable signal 460 is active. The memory device may then perform a read operation after the test mode is disabled to detect whether a fault exists in the control line 410, supply line 450, or both.

Figure 5:
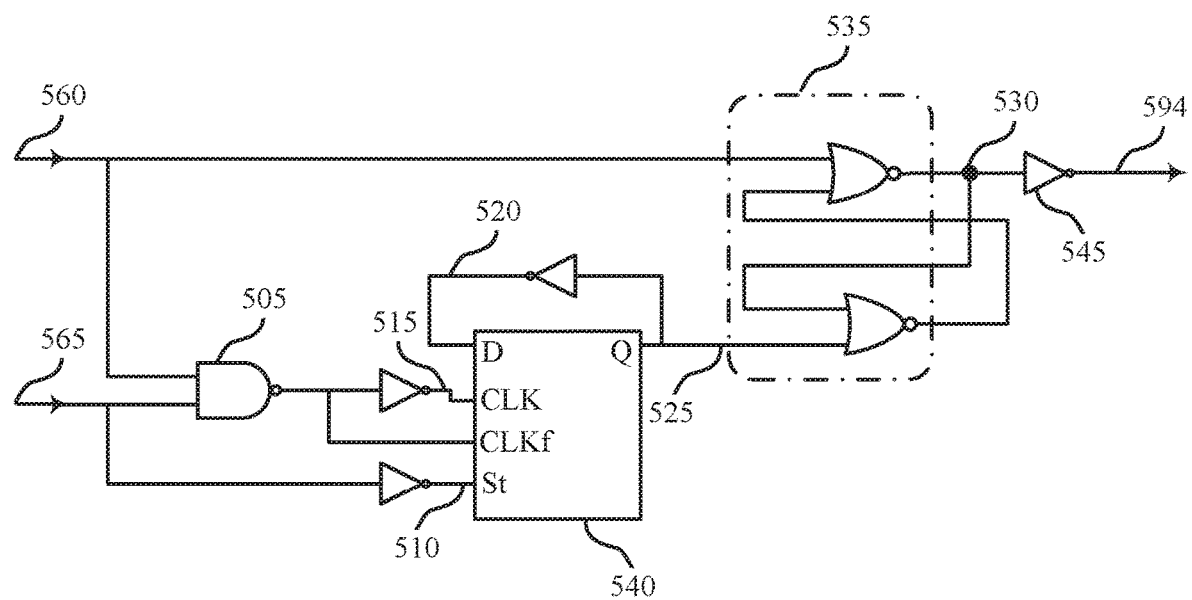
FIG. 5 illustrates an example of a column enable latch that supports identifying high impedance faults in a memory device in accordance with examples as disclosed herein.

FIG. 5 illustrates a column enable latch 500 that supports identifying high impedance faults in a memory device in accordance with examples as disclosed herein. The column enable latch 500 may be an example of the column enable latch 492 as described with reference to FIG. 4. The column enable latch 500 may include aspects of the column enable latch 492 as described with reference to FIG. 4, For example, column enable signal 560 may be an example of the column enable signal 460 as described with reference to FIG. 4; test mode signal 565 may be an example of test mode signal 465 as described with reference to FIG. 4; and latch signal 594 may be an example of the latch signal 494 as described with reference to FIG. 4. The column enable latch 500 may further include a NAND gate 505, inverters 545, an output signal 525 and 530, a latch 535, and a logic 540. The logic 540 may further include a clock (e.g., CLK) with a clock input 515, a clock face (e.g., CLKf), a set input 510 (e.g., St), and an input signal 520 (e.g. D) and output value (e.g., Q or the output signal 525).

As described with reference to FIG. 4, the column enable latch 500 may generate a latch signal 594 to activate a driver and establish a connection between a control line and supply line during a test operation based on receiving a first column enable signal 560. The column enable latch 500 may also keep the latch signal 594 activated until a second column enable signal 560 is received at the column enable latch 500. The column enable latch 500 may also deactivate the control line following the second column enable signal 560 being deactivated. Additionally, the column enable latch circuit 500 may be configured in various ways to generate the latch signal 594 and the example disclosed herein is not limiting.

Before the memory device performs a test operation, the test mode signal 565 may be deactivated. When the test mode signal is deactivated, the set input 510 is active as the test mode signal 565 is inverted. In this example, when the set input 510 is active, it may have a logic value 1 and be in a high state. When the set input 510 is active, it may override the input signal 520 (e.g., D) of logic 540 and maintain an active output signal 525. Output signal 525 may also be sent to the latch 535. The latch 535 may be an example of an NOR SR latch or a flip-flop switch. That is, the latch 535 may include two NOR gates where the output of the upper NOR gate is also an input of the lower NOR gate and the output of the lower NOR gate is also an input of the upper NOR gate. Additionally, the latch 535 may receive the column enable signal 560 (e.g. a first input) and the output signal 525 (e.g. a second input) at the other two inputs. The latch 535 may receive a column enable signal 560 (e.g., ColEnIn) during a normal write operation (e.g., a write operation preformed when the memory device has deactivated all test mode signals). The column enable signal 560 may configure the latch 535 to generate a deactivated output signal 530 based on the column enable signal 560 and the output signal 525 being active. The inverter 545 may invert output signal 530 and generate an active latch signal 594. As described with reference to FIGS. 3 and 4, when the latch signal 594 is active, a connection between the control line and supply line may be established and a sense component associated with a column address received may be activated.

When the memory device deactivates the column enable signal 560, the latch 535 generates an active output signal 530 based on the deactivated column enable signal 560 and the output signal 525 maintain an active state. The inverter 545 may invert the output signal 530 and generate a deactivated latch signal 594 that deactivates the driver of circuit diagram 400 and disconnects the control line and supply line.

When the memory device performs a test operation, the test mode signal 565 may be activated. In this example, when the test mode signal is active, it may have a logic value 1 and be in a high state. The test mode signal 565 is inverted and it generates a deactivated set input 510. When the set input 510 is deactivated, it may have a logic value 0 and be in a low state. A low set input 510 may stop overriding the logic 540 and enable input signal 520 to be clocked to the output signal 525. As the output signal 525 was at an active state before the set input 510 went low, the input signal 520 may be deactivated after the inverter inverts the output signal 525. The column enable latch 500 may then receive a first activation of column enable signal 560. The first activation of column enable signal 560 may also be received at the first input of the latch 535. As the latch 535 receives the first activation of column enable signal 560, the NAND gate 505 also receives the first activation of column enable signal 560. The NAND gate 505 may be configured to generate a deactivated signal based on the first activation of column enable signal 560 and test mode signal 565 both being active. The clock input 515 may be activated and enable the clock of logic 540 based on the inverter inverting the signal from NAND gate 505. When the logic 540 clock receives the enabled clock input 515, it clocks the input signal 520 to the output signal 525. In this case, the input signal 520 is deactivated and thus the output signal 525 also gets deactivated. The latch 535 is configured to latch a deactivated output signal 530 based on the first column enable signal 560 being active and the output signal 525 being deactivated. The inverter 545 inverts the deactivated output signal 530 and generates an active latch signal 594. As described with reference to FIGS. 3 and 4, when the latch signal 594 is active, a connection between the control line and supply line may be established and a sense component associated with a column address received may be activated.

The column enable latch 500 may then receive a second activation of column enable signal 560 (e.g., for a second write operation). As the latch 535 receives the second activation of column enable signal 560, the NAND gate 505 also receives the second activation of column enable signal 560. The NAND gate 505 generates another deactivated signal based on the second activation of column enable signal 560 and the test mode signal 565 being active. This may generate another enabling clock input 515 for the logic 540 clock. In this example, the input signal 520 may be at an active state as the inverter inverts the deactivated output signal 525 discussed above. The logic 540 clock then clocks the input signal 520 and logic 540 generates an active output signal 525 based on receiving the enabling clock input 515. The latch 535 may be configured to generate a deactivated output signal 530 based on the second activation of column enable signal 560 and output signal 525 both being active. Output signal 530 is then inverted by inverter 545 to generate an active latch signal 594. As described with reference to FIGS. 3 and 4, when the latch signal 594 is active, a connection between the control line and supply line may be established. When the memory device deactivates the second activation of column enable signal 560, the latch 535 may be configured to generate an activated output signal 530 based on second column enable signal 560 being deactivated and signal output 525 being active. The inverter 545 may invert the output signal 530 and generate a deactivated latch signal 594. As described with reference to FIGS. 3 and 4, when the latch signal 594 is deactivated, a connection between the control line and supply line may be deactivated and a sense component associated with a column address received may also be deactivated.

Additionally, as described with reference to FIGS. 2 and 3, the memory device may write a first set of data to a memory cell during the first write operation as the first column enable signal 560 is received by the column enable latch 500. The memory device may also write a second set of data to the same memory cell during the second write operation as the second column enable signal 560 is received by the column enable latch 500. The memory device may then perform a read operation after the test mode is disabled to detect whether a fault exists in the control line, supply line, or both.

Figure 6:
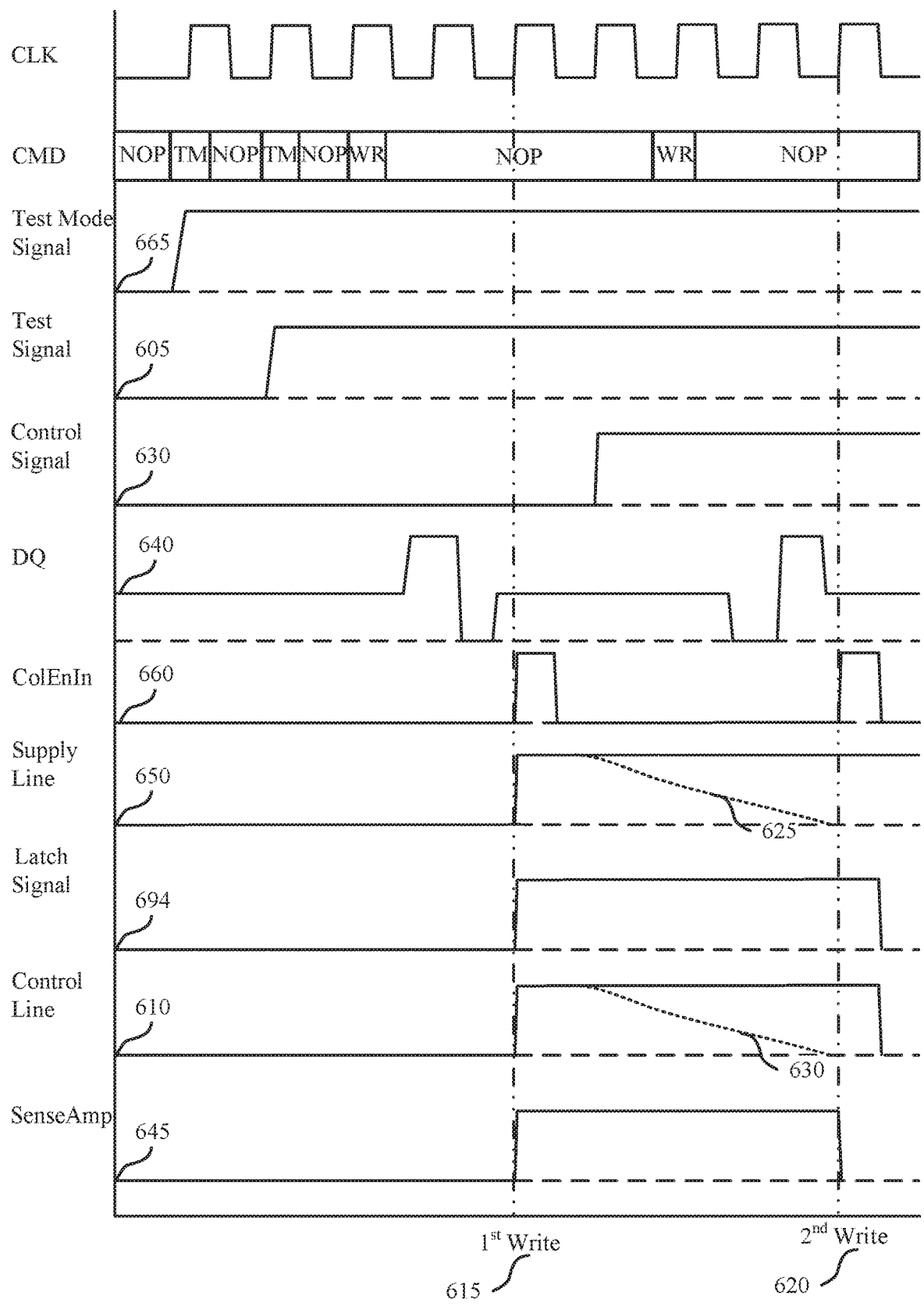
FIG. 6 illustrates an example of a timing diagram that supports identifying hi impedance faults in a memory device in accordance with examples as disclosed herein.

FIG. 6 illustrates a timing diagram 600 that supports identifying high impedance faults in a memory device in accordance with examples as disclosed herein. The timing diagram 600 may include aspects of the circuit diagram 400 as described with reference to FIG. 4 and the column enable latch 500 as described with reference to FIG. 5. For example, test mode signal 665 may be an example of test mode signal 465 as described with reference to FIG. 4; test signal 605 may be an example of test signal 405 as described with reference to FIG. 4; control signal 630 may be an example of control signal 430 as described with reference to FIG. 4; DQ 640 may be an example of an input and output of the logic 540 as described with reference to FIG. 5; ColEnIn signal 660 may be an example of column enable signal 460 as described with reference to FIG. 4; supply line 650 may be an example of supply line 450 as described with reference to FIG. 4; latch signal 694 may be an example of the latch signal 494 as described with reference to FIG. 4; control line 610 may be an example of control line 410 as described with reference to FIG. 4; and sense amp signal 645 may be an example of a signal associated with sense component 245 as described with reference to FIG. 2.

As described with reference to FIGS. 2 and 3, a memory device may implement a column select circuit to decode a received column address; select a control line associated with a memory cell and the column address, activate a sense component to drive an output onto a digit line and perform an access operation on the memory cell. In some cases, the memory device may perform a test operation to detect a fault in the control line, supply line, or both.

A memory device may initiate a test mode by first sending a test mode signal 665. The memory device may then send a test signal 605. After activating the test mode signal 665 and the test signal 605; the memory device may initiate a test operation. The memory device may issue a first write command 615 as part of the test operation. When the memory device issues the first write command 615, the memory device may send a ColEnIn signal 660 to the column enable latch 500 as described with reference to FIG. 5. The ColEnIn signal 660 being active may cause the latch signal 694 being active based on the test mode signal 665 and the ColEnIn signal 660 both being active as described with reference to FIG. 5. The latch signal 694 may be latched and kept active until the second write operation 620 has been performed. That is, the latch signal 694 may stay active until a second ColEnIn signal 660 is sent by the memory device as described with reference to FIG. 5. Additionally, the ColEnIn 660 signal may stay active for one clock cycle of the memory device before being deactivated.

Additionally, the memory device may establish a connection between the supply line 650 and control line 610 based on the latch signal 694 being active. After establishing a connection between the supply line 650 and the control line 610, the control line 610 may activate the sense amp signal 645 and enable the memory device to perform the first write operation 615 as described with reference to FIG. 3. The memory device may write a first set of data to the memory cell during the first write operation 615 based on the sense amp signal 645 being activated. After the memory device issues the first write command 615, but before the memory device issues the second write command 620, the memory device may send a control signal 630 to the column select circuit. The control signal 630 may be configured to isolate the supply line 650 and as a result, float the supply line 650 until the second write operation 620 has been performed as described with reference to FIG. 4.

The memory device may then issue a second write command 620 after a predetermined period following the first write command 615. The memory device may calculate the predetermined period based on a duration for a high impedance short to drop the voltages across the supply line 650 and the control line 610. Additionally, the memory device may calculate the predetermined period to limit components without faults to parasitic resistances. As the control line 610 is maintained in an active state, the sense amp signal 645 may stay activated allowing the memory device to perform the second write operation. The memory device may attempt to write a second set of data (e.g., data in an opposite state from the first set of data) to the memory cell during the second write operation 620.

The memory device may send another ColEnIn signal 660 as a result of issuing the second write command 620. The column enable latch may receive the second ColEnIn signal 660 and generate a different value for latch signal 694. That is, the second ColEnIn signal 660 may deactivate the latch signal 694 after the ColEnIn signal 660 is deactivated as described with reference to FIG. 5. When the latch signal 694 is deactivated, the control line 610 is deactivated and is disconnected from the supply line 650 as described with reference to FIG. 5.

The memory device may write the second set of data during the second write operation 620 based on absence of a fault in the supply line 650 and the control line 610. That is, when the control line 610, supply line 650, or both contain a high impedance short, the voltage across the supply line 650 may drop as indicated by 625 and the voltage across the control line 610 may drop as indicated by 630. When the supply line 650 voltage or control line 610 voltage drop, the control line 610 is deactivated. The pass transistor located in the sense component (or located between the sense component associated with sense amp signal 645 and the digit line (e.g., an example pass transistor 390 as described with reference to FIG. 3)) may be deactivated based on control line 610 being deactivated. The memory device may be unable to write the second set of data during the second write operation 620 when the pass transistor is deactivated. Thus, the memory cell retains the first set of data associated with the first write operation 615.

In other examples, the control line 610 and the supply line 650 may not have a fault present. In that case, the control line 610 and supply line 650 may be maintained in an active state during the duration of the test operation, even while floated based on the control signal 630. Thus, the pass transistor in the sense component (or between the sense component associated with sense amp signal 645 and digit line) remains active and the memory device may write the second set of data to the memory cell.

The memory device may deactivate the testing operation by deactivating the test mode signal 665 and the test signal 605 after the second write operation is performed. Subsequently, the memory device may perform a read operation on the memory cell to determine the existence of the fault. If the memory device reads the first data from the memory cell, the memory device may determine the control line 610, supply line 650, or both may contain a detect. If the memory device reads the second set of data from the memory cell, the memory device may determine an absence of a defect in the control line 610, supply line 650, or both. For example, the memory device may write a logic state 1 to the memory cell during the first operation. The memory device may then attempt to write a logic state 0 to the memory cell during the second operation. If the memory device reads a logic state 1 during the read operation after the test mode operation is complete, the memory device may have a fault in the supply line 650, control line 610, or both (e.g., the memory device may be unable to write the logic state 0 during the second write operation). In contrast, if the memory device reads a logic state 0 from the memory cell, an absence of a defect in the control line 610, supply line 650, or both may be detected.

Figure 7:
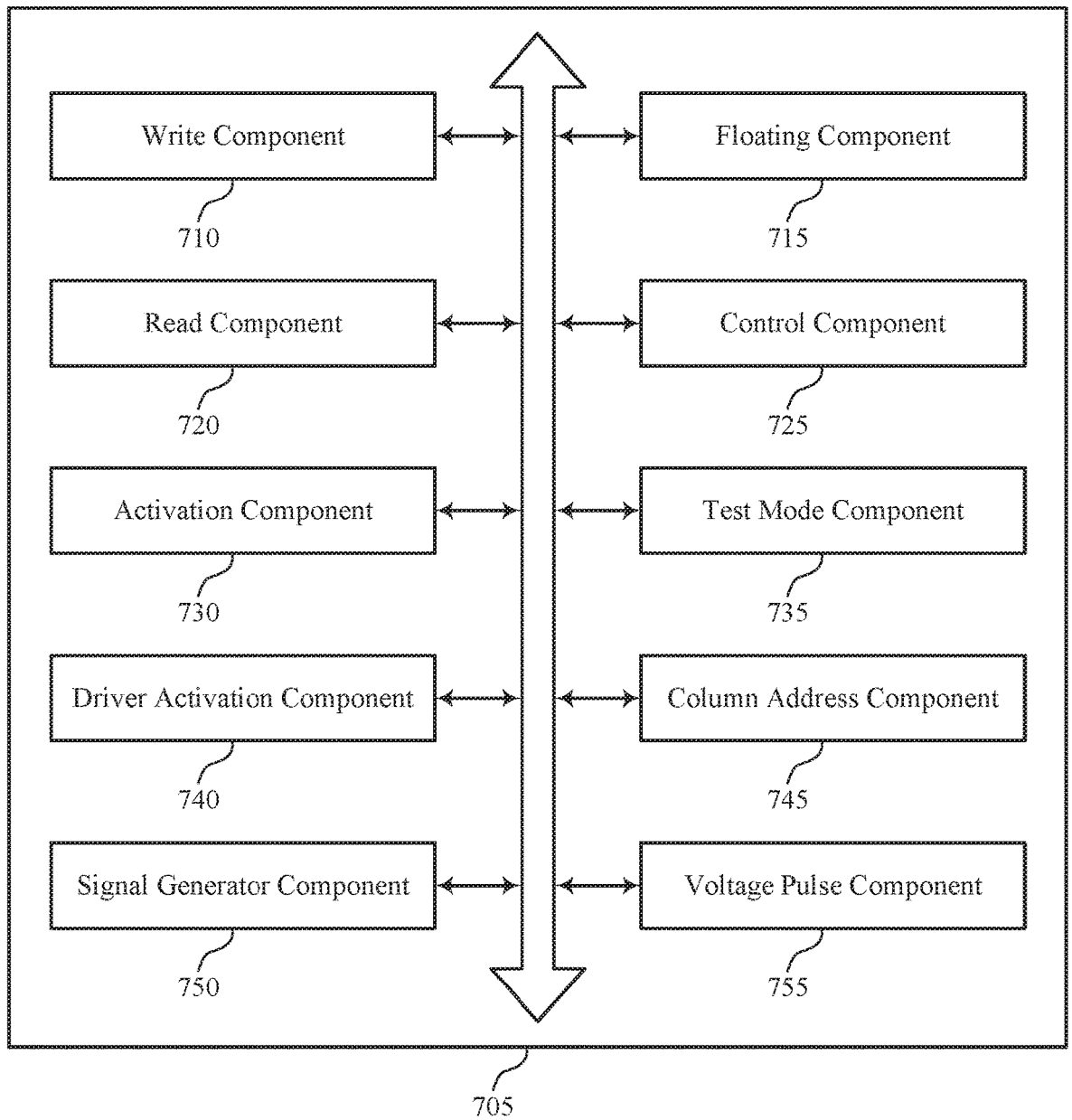
FIG. 7 shows a block diagram of a memory device that supports identifying high impedance faults in a memory device in accordance with aspects of the present disclosure.

FIG. 7 shows a block diagram 700 of a memory device 705 that supports identifying high impedance faults in a memory device in accordance with examples as disclosed herein. The memory device 705 may be an example of aspects of a memory device as described with reference to FIGS. 1-6. The memory device 705 may include a write component 710, a floating component 715, a read component 720, a control component 725, an activation component 730, a test mode component 735, a driver activation component 740, a column address component 745, a signal generator component 750, and a voltage pulse component 755. Each of these modules may communicate, directly or indirectly, with one another (e.g., via one or more buses).

The write component 710 may perform a first operation for writing a first logic state to a memory cell that is coupled with a digit line. In some examples, the write component 710 may perform, while the connection is established and after performing the first operation, a second operation for writing a second logic state to the memory cell based on configuring the supply line in the floating state. In some cases, the write component 710 may receive a first command to write the first logic state to the memory cell, where the first operation is performed based on receiving the first command. In some instances, the write component 710 may receive a second command to write the second logic state to the memory cell after the first command is received, where the second operation is performed based on receiving the second command.

The floating component 715 may establish a connection between a supply line and a control line associated with applying an output of a driver of the digit line based on performing the first operation. In some examples, the floating component 715 may configure, while the connection is established, the supply line in a floating state based on performing the first operation. In some cases, the floating component 715 may deactivate a switch that is coupled with a voltage source and the supply line after a completion of the first operation based on a first signal that deactivates the switch. In some instances, the floating component 715 may disable circuitry that is coupled with the voltage source and the supply line after the completion of the first operation and before the second operation based on a second signal that disables the circuitry, where the supply line is configured in the floating state based on the first signal and the second signal.

The read component 720 may perform a third operation for reading the memory cell, where a condition of the supply line or the control line is determined based on a result of the third operation. In some examples, the read component 720 may read the first logic state from the memory cell based on performing the third operation, where a presence of a defect associated with the supply line or the control line is indicated based on reading the first logic state. In some cases, the read component 720 may read the second logic state from the memory cell based on performing the third operation, where an absence of a defect associated with the supply line and the control line is indicated based on reading the second logic state.

The control component 725 may receive a signal that controls a state of the supply line, where a first value for the signal couples the supply line with a voltage source and a second value for the signal isolates the supply line from the voltage source.

The activation component 730 may receive a third signal that indicates a reception of a command to activate a section of a memory array that includes the memory cell.

The test mode component 735 may receive a third signal that indicates an activation of a test mode and a fourth signal associated with isolating the supply line from the voltage source.

The driver activation component 740 may activate a driver of the control line after receiving the first command and at least until the second command is received based on receiving a first signal.

The column address component 745 may receive a second signal that includes a column address associated with the memory cell.

The signal generator component 750 may combine the second signal with the third signal, where the first signal is generated based on the combining. In some examples, the signal generator component 750 may combine the fourth signal with the third signal, where the second signal is generated based on the combining. In some cases, the signal generator component 750 may generate a third signal that has a first value after receiving the first command to write the first logic state to the memory cell and until the second command to write the second logic state is received, where the third signal has a second value after receiving the second command. In some instances, the signal generator component 750 may combine the second signal with the third signal, where the first signal is generated based on the combining.

The voltage pulse component 755 may transition the third signal to a first value based on a first voltage pulse associated with the first command. In some examples, the voltage pulse component 755 may transition the third signal to a second value based on a completion of a second voltage pulse associated with the second command.

Figure 8:
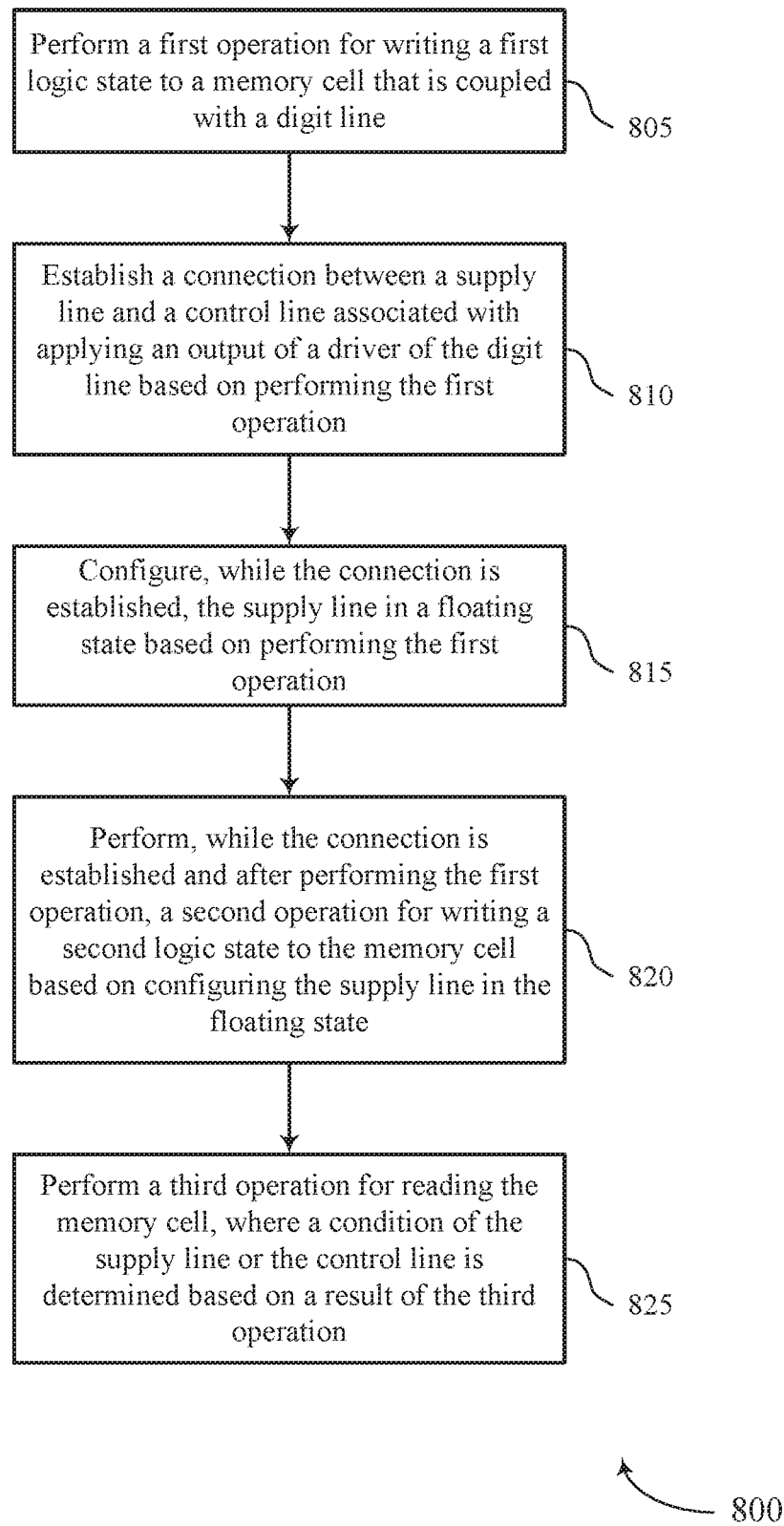
FIG. 8 shows a flowchart illustrating a method or methods that support identifying high impedance faults in a memory device in accordance with examples as disclosed herein.

FIG. 8 shows a flowchart illustrating a method or methods 800 that supports identifying high impedance faults in a memory device in accordance with aspects of the present disclosure. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may perform a first operation for writing a first logic state to a memory cell that is coupled with a digit line. The operations of 805 may be performed according to the methods described herein. In some examples, aspects of the operations of 805 may be performed by a first write component as described with reference to FIG. 7.

At 810, the memory device may establish a connection between a supply line and a control line associated with applying an output of a driver of the digit line based on performing the first operation. The operations of 810 may be performed according to the methods described herein. In some examples, aspects of the operations of 810 may be performed by a line connection component as described with reference to FIG. 7.

At 815, the memory device may configure, while the connection is established, the supply line in a floating state based on performing the first operation. The operations of 815 may be performed according to the methods described herein. In some examples, aspects of the operations of 815 may be performed by a floating component as described with reference to FIG. 7.

At 820, the memory device may perform, while the connection is established and after performing the first operation, a second operation for writing a second logic state to the memory cell based on configuring the supply line in the floating state. The operations of 720 may be performed according to the methods described herein. In some examples, aspects of the operations of 820 may be performed by a second write component as described with reference to FIG. 7.

At 825, the memory device may perform a third operation for reading the memory cell, where a condition of the supply line or the control line is determined based on a result of the third operation. The operations of 825 may be performed according to the methods described herein. In some examples, aspects of the operations of 825 may be performed by a read component as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for performing a first operation for writing a first logic state to a memory cell that is coupled with a digit line, establishing a connection between a supply line and a control line associated with applying an output of a driver of the digit line based on performing the first operation. The apparatus may further include features, means, or instructions for, configuring, while the connection is established, the supply line in a floating state based on performing the first operation, performing, while the connection is established and after performing the first operation, a second operation for writing a second logic state to the memory cell based on configuring the supply line in the floating state, and performing a third operation for reading the memory cell, where a condition of the supply line or the control line is determined based on a result of the third operation.

Some cases of the method 800 and the apparatus described herein may further include operations, features, means, or instructions for reading the first logic state from the memory cell based on performing the third operation, where a presence of a defect associated with the supply line or the control line may be indicated based on reading the first logic state.

Some instances of the method 800 and the apparatus described herein may further include operations, features, means, or instructions for reading the second logic state from the memory cell based on performing the third operation, where an absence of a defect associated with the supply line and the control line may be indicated based on reading the second logic state.

Some examples of the method 800 and the apparatus described herein may further include operations, features, means, or instructions for receiving a signal that controls a state of the supply line, where a first value for the signal couples the supply line with a voltage source and a second value for the signal isolates the supply line from the voltage source.

Some cases of the method 800 and the apparatus described herein may further include operations, features, means, or instructions for deactivating a switch that may be coupled with a voltage source and the supply line after a completion of the first operation based on a first signal that deactivates the switch, and disabling circuitry that may be coupled with the voltage source and the supply line after the completion of the first operation and before the second operation based on a second signal that disables the circuitry, where the supply line may be configured in the floating state based on the first signal and the second signal.

Some instances of the method 800 and the apparatus described herein may further include operations, features, means, or instructions for receiving a third signal that indicates a reception of a command to activate a section of a memory array that includes the memory cell, and combining the second signal with the third signal, where the first signal may be generated based on the combining.

Some examples of the method 800 and the apparatus described herein may further include operations, features, means, or instructions for receiving a third signal that indicates an activation of a test mode and a fourth signal associated with isolating the supply line from the voltage source, and combining the fourth signal with the third signal, where the second signal may be generated based on the combining.

Some cases of the method 800 and the apparatus described herein may further include operations, features, means, or instructions for receiving a first command to write the first logic state to the memory cell, where the first operation may be performed based on receiving the first command, and receiving a second command to write the second logic state to the memory cell after the first command may be received, where the second operation may be performed based on receiving the second command.

Some instances of the method 800 and the apparatus described herein may further include operations, features, means, or instructions for activating a driver of the control line after receiving the first command and at least until the second command may be received based on receiving a first signal.

Some examples of the method 800 and the apparatus described herein may further include operations, features, means, or instructions for receiving a second signal that includes a column address associated with the memory cell, generating a third signal that may have a first value after receiving the first command to write the first logic state to the memory cell and until the second command to write the second logic state may be received, where the third signal may have a second value after receiving the second command, and combining the second signal with the third signal, where the first signal may be generated based on the combining.

Some cases of the method 800 and the apparatus described herein may further include operations, features, means, or instructions for transitioning the third signal to a first value based on a first voltage pulse associated with the first command, and transitioning the third signal to a second value based on a completion of a second voltage pulse associated with the second command.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory cell, a driver coupled with a control line and a supply line, where the control line is associated with an access operation for the memory cell, first logic configured to generate a first signal for activating the driver after receiving a first command to write to the memory cell and configured to activate the driver at least until a second command to write to the memory cell is received, and second logic configured to generate a second signal for isolating the supply line from a voltage source after the first command is received and before the second command is received.

Some examples of the apparatus may include a switch coupled with the voltage source, the supply line, and the second logic, where the second logic may be configured to operate the switch.

Some cases of the apparatus may include circuitry coupled with the voltage source, the supply line, and the second logic, where the circuitry may be configured to clamp a voltage of the supply line from going below a predetermined level, and where the second logic includes, a first logic gate configured to generate the second signal, where the switch may be deactivated based at least in part after the first command may be received and before the second command may be received based on the second signal, and a second logic gate configured to generate a third signal having a value for disabling the circuitry after the first command may be received and before the second command may be received, where the supply line may be isolated from the voltage source based on the second signal and the third signal.

In some instances, the first logic may include operations, features, means, or instructions for a third logic configured to generate a third signal for selecting a digit line coupled with the memory cell after receiving the first command, where the third logic may be further configured to select the digit line at least until receiving the second command, and fourth logic configured to generate the first signal based on the third signal and a fourth signal including a column address.

In some cases, the third logic may include operations, features, means, or instructions for a flip flop configured to generate a fifth signal based on a sixth signal for gating selection of the digit line, where the sixth signal includes a first voltage pulse associated with the first command and a second voltage pulse associated with the second command, and fifth logic configured to generate the third signal based on the fifth signal generated by the flip flop and the sixth signal.

In some instances, the fourth logic may include operations, features, means, or instructions for an address decoder configured to decode the column address from the third signal, where the address decoder may be further configured to generate the first signal based on the column address being associated with the digit line.

Some examples of the apparatus may include a digit line coupled with the memory cell, and a driver for the digit line, where the control line may be configured to convey a signal for applying an output of the driver for the digit line to the digit line.

An apparatus is described. The apparatus may include a memory cell coupled with a digit line, a first driver, a second driver configured to output a control line associated with applying an output of the first driver to the digit line, a memory controller coupled with the memory cell, the first driver, and the second driver, where the memory controller is operable to, perform a first operation for writing a first logic state to the memory cell, establish a connection between a supply line and the control line based on the first operation, configure, while the connection is established, the supply line in a floating state after performing the first operation, perform, while the connection is established and after performing the first operation, a second operation for writing a second logic state to the memory cell based on configuring the supply line in the floating state, perform a third operation for reading the memory cell, and determine a condition of the supply line or the control line based on a result of the third operation.

In some cases, the controller may be further operable to detect a presence of a defect associated with the supply line or the control line based on the result of the third operation including reading the first logic state from the memory cell.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FEE If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
establishing an electrical connection between a supply line and a control line associated with applying an output of a driver of a digit line, the supply line electrically connected to a voltage source;
performing a first operation for writing a first logic state to a memory cell that is coupled with the digit line based at least in part on establishing the electrical connection;
isolating, while the electrical connection between the supply line and the control line is established, the supply line from the voltage source based at least in part on performing the first operation;
performing, after performing the first operation and while the electrical connection between the supply line and the control line is established and the supply line is isolated from the voltage source, a second operation for writing a second logic state to the memory cell; and
performing a third operation for reading the memory cell, wherein a condition of the supply line or the control line is determined based at least in part on a result of the third operation.

2. The method of claim 1, further comprising:
reading the first logic state from the memory cell based at least in part on performing the third operation, wherein a presence of a defect associated with the supply line or the control line is indicated based at least in part on reading the first logic state.

3. The method of claim 1, further comprising:
reading the second logic state from the memory cell based at least in part on performing the third operation, wherein an absence of a defect associated with the supply line and the control line is indicated based at least in part on reading the second logic state.

4. The method of claim 1, further comprising:
receiving a signal that controls a state of the supply line, wherein a first value for the signal electrically connects the supply line with the voltage source and a second value for the signal isolates the supply line from the voltage source.

5. The method of claim 1, further comprising:
deactivating a switch that electrically connects the voltage source and the supply line after a completion of the first operation based at least in part on a first signal that deactivates the switch; and
disabling circuitry that is coupled with the voltage source and the supply line after the completion of the first operation and before the second operation based at least in part on a second signal that disables the circuitry, wherein the supply line is isolated from the voltage source based at least in part on the first signal and the second signal.

6. The method of claim 5, further comprising:
receiving a third signal that indicates a reception of a command to activate a section of a memory array that comprises the memory cell; and
combining the second signal with the third signal, wherein the first signal is generated based at least in part on the combining.

7. The method of claim 5, further comprising:
receiving a third signal that indicates an activation of a test mode and a fourth signal associated with isolating the supply line from the voltage source; and
combining the fourth signal with the third signal, wherein the second signal is generated based at least in part on the combining.

8. The method of claim 1, further comprising:
receiving a first command to write the first logic state to the memory cell, wherein the first operation is performed based at least in part on receiving the first command; and
receiving a second command to write the second logic state to the memory cell after the first command is received, wherein the second operation is performed based at least in part on receiving the second command.

9. The method of claim 8, further comprising:
activating a driver of the control line after receiving the first command and at least until the second command is received based at least in part on receiving a first signal.

10. The method of claim 9, further comprising:
receiving a second signal that comprises a column address associated with the memory cell;
generating a third signal that has a first value after receiving the first command to write the first logic state to the memory cell and until the second command to write the second logic state is received, wherein the third signal has a second value after receiving the second command; and
combining the second signal with the third signal, wherein the first signal is generated based at least in part on the combining.

11. The method of claim 10, further comprising:
transitioning the third signal to the first value based at least in part on a first voltage pulse associated with the first command; and
transitioning the third signal to the second value based at least in part on a completion of a second voltage pulse associated with the second command.

12. An apparatus, comprising:
a memory cell;
a driver coupled with a control line and a supply line, wherein the control line is associated with an access operation for the memory cell;
first logic configured to generate a first signal for activating the driver after receiving a first command to write to the memory cell and configured to activate the driver at least until a second command to write to the memory cell is received; and
second logic configured to generate a second signal for isolating the supply line from a voltage source after the first command is received and before the second command is received.

13. The apparatus of claim 12, further comprising:
a switch coupled with the voltage source, the supply line, and the second logic, wherein the second logic is configured to operate the switch.

14. The apparatus of claim 13, further comprising:
circuitry coupled with the voltage source, the supply line, and the second logic, wherein the circuitry is configured to clamp a voltage of the supply line from going below a predetermined level, and wherein the second logic comprises;
a first logic gate configured to generate the second signal, wherein the switch is deactivated based at least in part after the first command is received and before the second command is received based at least in part on the second signal; and
a second logic gate configured to generate a third signal having a value for disabling the circuitry after the first command is received and before the second command is received, wherein the supply line is isolated from the voltage source based at least in part on the second signal and the third signal.

15. The apparatus of claim 12, wherein the first logic comprises:
third logic configured to generate a third signal for selecting a digit line coupled with the memory cell after receiving the first command, wherein the third logic is further configured to select the digit line at least until receiving the second command; and
fourth logic configured to generate the first signal based at least in part on the third signal and a fourth signal comprising a column address.

16. The apparatus of claim 15, wherein the third logic comprises:
a flip flop configured to generate a fifth signal based at least in part on a sixth signal for gating selection of the digit line, wherein the sixth signal comprises a first voltage pulse associated with the first command and a second voltage pulse associated with the second command; and
fifth logic configured to generate the third signal based at least in part on the fifth signal generated by the flip flop and the sixth signal.

17. The apparatus of claim 15, wherein the fourth logic comprises an address decoder configured to decode the column address from the third signal, wherein the address decoder is further configured to generate the first signal based at least in part on the column address being associated with the digit line.

18. The apparatus of claim 12, further comprising:
a digit line coupled with the memory cell; and
a driver for the digit line, wherein the control line is configured to convey a signal for applying an output of the driver for the digit line to the digit line.

19. An apparatus, comprising:
a memory cell coupled with a digit line,
a voltage source,
a first driver,
a second driver configured to drive a control line that is associated with applying an output of the first driver to the digit line, and
a memory controller coupled with the memory cell, the first driver, and the second driver, wherein the memory controller is operable to:
establish an electrical connection between a supply line and the control line, the supply line electrically connected to the voltage source;
perform a first operation for writing a first logic state to the memory cell that is coupled with the digit line based at least in part on establishing the electrical connection between the supply line and the control line;
isolate, while the electrical connection is established, the supply line from the voltage source after performing the first operation;
perform, after performing the first operation and while the electrical connection between the supply line and the control line is established and after the supply line is isolated from the voltage source, a second operation for writing a second logic state to the memory cell;
perform a third operation for reading the memory cell; and
determine a condition of the supply line or the control line based at least in part on a result of the third operation.

20. The apparatus of claim 19, wherein the memory controller is further operable to:
detect a presence of a defect associated with the supply line or the control line based at least in part on the result of the third operation comprising reading the first logic state from the memory cell.

* * * * *